United States Patent [19]

Rogers

[11] 4,213,066

[45] Jul. 15, 1980

[54] SOLID STATE SWITCH

[75] Inventor: Wesley A. Rogers, Grosse Pointe Park, Mich.

[73] Assignee: General Motors Corporation, Detroit, Mich.

[21] Appl. No.: 932,716

[22] Filed: Aug. 11, 1978

[51] Int. Cl.$^2$ .................. H03K 17/72

[52] U.S. Cl. .................. 307/252 C; 307/253; 307/305

[58] Field of Search .................. 307/252 C, 253, 303, 307/291, 305

[56] References Cited

U.S. PATENT DOCUMENTS

| | | | |
|---|---|---|---|
| 3,064,145 | 11/1962 | Heckelman | 307/237 |
| 3,343,046 | 9/1967 | Ladd, Jr. | 307/252 C |
| 3,343,104 | 9/1967 | Motto, Jr. | 307/252 C |
| 3,504,197 | 3/1970 | Shibuya | 307/252 C |
| 3,891,866 | 6/1975 | Okuhara et al. | 307/252 C |
| 4,117,351 | 9/1978 | Kalfus et al. | 307/252 C |

*Primary Examiner*—John Zazworsky
*Attorney, Agent, or Firm*—C. R. Meland

[57] ABSTRACT

A semiconductor circuit actuable by a low power input signal for controlling the application of a power source to a load. The input signal is applied to a control circuit for biasing a gate controlled switch (GCS) on and off. The control circuit comprises a diode responsive to a positive input signal for conducting turn-on bias current from the input to the gate electrode of the GCS, and a pull-down transistor responsive to a ground potential input signal for conducting turn-off bias current from the gate electrode of the GCS to a ground potential. A power transistor responsive to the state of conduction of the GCS operates to conduct current from the power source to the load when the GCS is turned on and to disconnect the power source from the load when the GCS is turned off.

3 Claims, 1 Drawing Figure

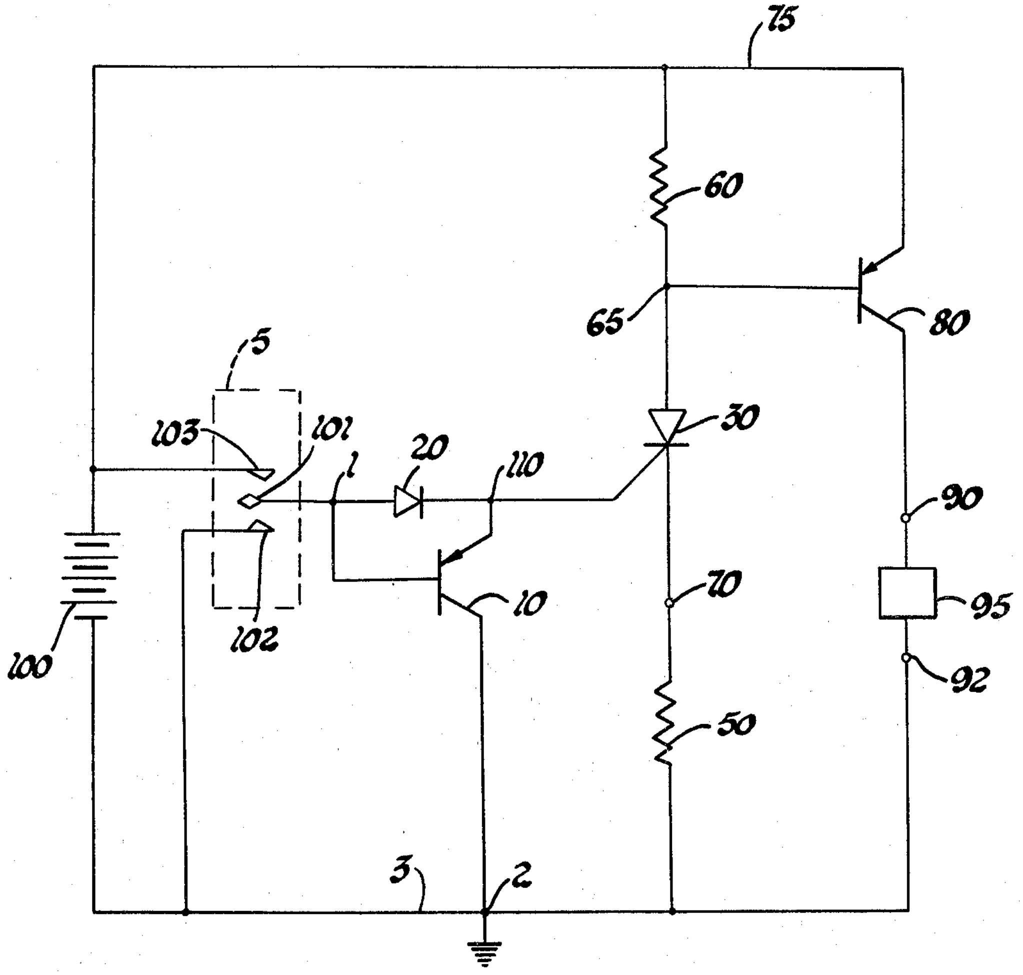
75
60
65
80
5
103
101
20
110
30
1
90
70
95
10
100
102
92
50
3
2

SOLID STATE SWITCH

This invention relates to semiconductor switching circuitry. More particularly, this invention relates to a switching circuit comprising a high current power transistor, a gate controlled switch (GCS), and a control circuit actuable by a low power input signal for biasing the GCS on and off. The GCS is a four-layer semiconductor device having anode, cathode, and gate electodes in which the bias applied to the gate electrode controls the current through the anode to cathode conduction path. The GCS is made conductive by bringing the gate to a higher voltage potential than the cathode. Once conductive, the device remains so until the gate is brought to a lower potential than the cathode, reversing the bias on the junction. The GCS possesses several characteristics that are desirable in switching circuitry. Unlike the transistor which requires continuous base current to maintain conduction, a short duration input pulse will bias the GCS into a conductive mode and it will remain conductive until the device is biased off. Furthermore, the GCS features fast turn-on and turn-off transistion times, and good noise insensitivity. The disadvantages of the GCS lie in its low power-handling capability, its high turn-off current requirements, and its peculiar biasing requirements. The problem of the low power-handling capability of the GCS has been avoided in prior art designs by using the conduction current of the GCS as control current to switch other semiconductor devices capable of handling higher load currents. The disadvantage of high turn-off gate current poses a problem, especially when it is desired to use a low power input signal, such as the output of a microprocessor without resorting to complicated driving circuitry. Due to the peculiar bias requirements of the GCS, prior art design attempts to use the device for switching applications have resorted to the implementation of charge storage elements (such as capacitors) or dual power supplies (one to turn the GCS on and one to turn the GCS off) in the control circuit. The use of dual power supplies adds complexity and expense to the circuit, and capacitors limit the switching frequency to the time constant of the capacitor and its associated charge path elements.

It is accordingly an object of this invention to provide a simple control circuit for biasing a gate controlled switch on and off which does not require capacitors or dual power supplies.

It is another object of this invention to provide a simple and reliable semiconductor switching circuit actuable by a low power input signal such as the output of a microprocessor or other electronic circuitry for biasing a gate controlled switch on and off, and in which the gate controlled switch controls the conduction of a transistor that is capable of switching large DC load currents.

In carrying forward the objects of this invention, there is provided a novel arrangement of a forward pass semiconductor diode to conduct the turn-on current of a GCS and a pull-down transistor to conduct the turn-off current of the GCS. When the GCS is biased conductive, it in turn biases a high current power transistor on to conduct current from a power supply, such as a motor vehicle battery, to a load, such as automobile headlamps. When the GCS is biased nonconductive, it in turn biases the power transistor off to disconnect the power supply from the load.

The single FIGURE drawing is a circuit diagram of a switching circuit made in accordance with this invention.

Referring now to the switching circuit shown in the drawing, numerals 1 and 2 designate the input terminals, numerals 90 and 92 designate the load output terminals, and numeral 3 designated a conductor which is connected to a ground or reference potential. Input terminal 2 is connected to conductor 3 and input terminal 1 is connected to input control circuit 5 which impresses a voltage potential thereon of ground potential, a higher voltage potential or no potential.

Input control circuit 5 is a general representation of how such an input might be provided and for this purpose is illustrated as a three position switch. Movable contact 101 may connect input terminal 1 to contact 102, which is connected to conductor 3 and the negative terminal of battery 100 or to contact 103 which is connected to the positive terminal of battery 100. When contact 101 is not engaged with either contact 102 or 103, no voltage is applied to input terminal 1. The GCS can be biased on by connecting input terminal 1 to the higher potential of contact 103. Once conductive, the GCS remains so when contact 101 is disconnected from contact 103. Then, the GCS can be biased off by connecting input terminal 1 to ground potential momentarily (contact 102), and then to a no potential position. The preferred form of input circuit is a microprocessor or other electronic circuitry, the output of which performs the same control function as that of a two position switch (high or ground potential applied to input terminal 1) or a three position switch (high, ground, or no potential applied to input terminal 1). More specifically, a two position switch is analogous to the output of a digital microprocessor or electronic circuit and a three position switch is analogous to the output of so-called tri-state circuitry.

The control circuit comprises: semiconductor diode 20, its anode connected to input terminal 1 and its cathode connected to junction 110; PNP transistor 10, its base connected to input terminal 1, its collector connected to conductor 3, and its emitter connected to junction 110; gate controlled switch 30, its gate connected to junction 110, to the cathode of diode 20, and to the emitter of transistor 10, its anode connected to junction 65, and its cathode connected to terminal 70; and resistor 50, its one side connected to terminal 70, and its other side connected to conductor 3. The circuit further includes resistor 60, having one side connected to junction 65 and the other side connected to conductor 75 which in turn is connected to the positive terminal of battery 100. The negative terminal of battery 100 is connected to ground or reference potential. The supply of power to load 95 is controlled by PNP power transistor 80, having a base connected to junction 65, an emitter connected to conductor 75, and a collector connected to output terminal 90. Load 95, has one side connected to output terminal 90 and its other side connected to output terminal 92, which in turn, is connected to conductor 3.

The operation of the switching circuit will now be described. When movable contact 101 connects input terminal 1 to contact 103, the positive terminal voltage of battery 100 appears at the anode of diode 20 and at the base of PNP transistor 10. The transistor 10 is reverse biased into its non-conducting state and diode 20 is forward biased, conducting turn-on current from battery 100 into the gate-cathode circuit of GCS 30, through registor 50 to ground. This turns on the GCS, providing a conduction path for bias current for power transistor 80. The conduction path is from battery 100, through the emitter-base circuit of transistor 80, the anode-cathode circuit of GCS 30 and resistor 50 to grounded conductor 3. Power transistor 80 is thereby biased on and conducts a large current in its emitter-collector circuit from battery 100, through load 95 to ground. Thus, transistor 80 conducts current to load 95 whenever GCS 30 is biased on.

It should be apparent that the potential used to turn on the GCS need not be the same as the potential that is applied to the load. Input control circuit 5 is so illustrated in the drawing only for convenience. The potential needed to turn on the GCS depends on the characteristics of the GCS; the potential from which power is supplied to the load depends on other considerations. Simply stated, the turn-on potential applied by input control circuit 5 can be as high or higher than the turn-on potential required by the GCS.

When it is desired to turn-off the GCS, movable contact 101 is connected to contact 102 so as to ground input terminal 1. Ground potential would then appear at the anode of diode 20 and at the base of transistor 10. The voltage potential at the gate of a conductively biased GCS is by nature slightly higher than that at its cathode. Accordingly, the voltage potential at junction 110 would be slightly higher than the voltage drop across resistor 50. Thus, the emitter-base circuit of transistor 10 becomes forward biased to turn on that transistor. Moreover, diode 20 becomes reverse biased since the voltage potential at the cathode exceeds that at the anode. Transistor 10 conducts current out of the gate of GCS 30 to grounded conductor 3, thereby pulling down the gate of GCS 30 to a lower potential than its cathode, turning GCS 30 off. When GCS 30 turns off, it cuts off the base current path of power transistor 80 so as to bias it nonconductive to disconnect battery 100 from load 95. Resistor 60 operates to pull up the voltage at the base of power transistor 80 to ensure complete turn off of that transistor when the GCS turns off. Once GCS 30 is turned off, the voltage thereby applied to the emitter of transistor 10 no longer substantially exceeds the voltage at its base and transistor 10 turns off, preventing further conduction of current from battery 100.

When movable contact 101 is reconnected to contact 103, current will be supplied to load 95 in the manner described above, and so on. The value of resistor 50 is chosen such that a sufficient amount of current is withdrawn from the base of power transistor 80 to drive the transistor into a heavily saturated mode of conduction without dissipating an excessive amount of power in resistor 50. If desired, resistor 50 could be replaced by an auxiliary load. For example, if load 95 were the headlamps of a motor vehicle, the vehicle parking lamps could take the place of resistor 50.

In the preferred embodiment, the circuit elements of the invention are as follows:

| | |
|---|---|
| battery 100 | 12 V |
| diode 20 | 1N914 |
| transistor 10 | 2N4403 |
| power transistor 80 | 2N5686 |
| GCS 30 | RCA G4000 |
| resistor 60 | 150 ohms, ½ W |
| resistor 50 | 10 ohms, 10 W |

As previously pointed out, one use for the solid state switch of this invention is to control the energization of the headlamps of a motor vehicle. In such a system, battery 100 is the 12 volt battery of the motor vehicle and load 95 represents the headlamps. The application of a positive potential to input terminal 1 will cause GCS 30 and power transistor 80 to conduct and thereby energize the headlamps. The headlamps remain energized until ground potential is applied to input terminal 1 whereupon GCS 30 and power transistor 80 are biased nonconductive to deenergize the headlamps.

The switching circuit of this invention represents an advance over the prior art in many ways. Not only does the circuit utilize the switching of the GCS and have exceptionally high power gain, the circuit is simple in design and, unlike the prior art, it does not require charge storage elements or dual voltage power supplies. Additionally, the circuit is easily susceptible to single integrated circuit implementation as all the semiconductors are PNPN devices.

I claim:

1. A control circuit for biasing a gate controlled switch on and off comprising means defining a reference voltage level, first and second input terminals, means connecting said second input terminal to said reference voltage level, means for selectively applying to said first input terminal a voltage level substantially equal to said reference voltage level or a higher voltage level, a gate controlled switch having an anode, a cathode, and a gate, a resistor connected between the cathode of said gate controlled switch and said reference voltage level, a diode having an anode connected to said first input terminal and a cathode connected to the gate of said gate controlled switch whereby said diode is operative to conduct turn-on bias current to said gate when said higher voltage level is applied to said first input terminal, a transistor having a base, an emitter, and a collector, means connecting the collector of said transistor to said reference voltage level, means connecting the base of said transistor to said first input terminal and to the anode of said diode, and means connecting the emitter of said transistor to the cathode of said diode and to the gate of said gate controlled switch whereby once the gate controlled switch is biased on and said reference voltage level is applied to said frist input terminal, said transistor is biased conductive in its emitter-collector circuit, reversing the bias on the gate-cathode circuit of said gate controlled switch to bias said gate controlled switch off.

2. A switching circuit for controlling the application of current to an electrical load, comprising: a source of direct voltage, means defining a reference voltage level connected to the negative terminal of said source of direct voltage, first and second input terminals, means connecting said second input terminal to said reference voltage level, means for selectively applying to said first input terminal a voltage level substantially equal to said reference voltage level or a higher voltage level, a gate controlled switch having an anode, a cathode, and a gate, a first resistor connected between the cathode of said gate controlled switch and said reference voltage level, a diode having an anode connected to said first input terminal and a cathode connected to the gate of said gate controlled switch, a transistor having a base, an emitter, and a collector, means connecting the collector of said transistor to said reference voltage level, means connecting the base of said transistor to said first input terminal and means connecting the emitter of said transistor to the gate of said gate controlled switch and to the cathode of said diode, a second resistor connector between the anode of said gate controlled switch and the positive terminal of said source of direct voltage, first and second output terminals adapted to be connected to an electrical load, means connecting said second output terminal to said reference voltage level, a power transistor having an emitter, a base and a collector, means connecting the emitter of said power transistor to the positive terminal of said source of direct voltage, means connecting the base of said power transistor to the anode of said gate controlled switch, and means connecting the collector of said power transistor to said first output terminal.

3. A switching circuit for controlling the applicaiton of current to an electrical load, comprising: a source of direct voltage, means defining a reference voltage level, first and second input terminals, means connecting said second input terminal to said reference voltage level, means for selectively applying to said first input terminal a voltage level substantially equal to said reference voltage level or a higher voltage level, a gate controlled switch having an anode, a cathode, and a gate, a resistor connected between the cathode of said gate controlled switch and said reference voltage level, a diode having an anode connected to said first input terminal and a cathode connected to the gate of said gate controlled switch whereby said diode is operative to conduct turn on bias current to said gate when said higher voltage level is applied to said first input terminal, a transistor having a base, an emitter, and a collector, means connecting the collector of said transistor to said reference voltage level, means connecting the base of said transistor to said first input terminal, means connecting the emitter of said transistor to the gate of said gate controlled switch and to the cathode of said diode, an electrical load, an output transistor, means connecting said electrical load and the collector-emitter circuit of said output transistor in series across said source of direct voltage, and means connecting said output transistor and said gate controlled switch such that said output transistor is biased conductive when said gate controlled switch is biased to conduct and said output transistor is biased non-conductive when said gate controlled switch is non-conductive, whereby the application of said reference and higher voltage levels to said first input terminal controls the application of current to said electrical load.

* * * * *